United States Patent [19]
Lu et al.

[11] Patent Number: 5,659,257
[45] Date of Patent: Aug. 19, 1997

[54] METHOD AND CIRCUIT STRUCTURE FOR MEASURING AND TESTING DISCRETE COMPONENTS ON MIXED-SIGNAL CIRCUIT BOARDS

[75] Inventors: Yunsheng Lu; Weiwei Mao, both of Colorado Springs, Colo.

[73] Assignee: Ford Motor Company, Dearborn, Mich.

[21] Appl. No.: 270,272

[22] Filed: Jul. 5, 1994

[51] Int. Cl.$^6$ .................................................. G01R 31/02
[52] U.S. Cl. ...................... 324/763; 324/537; 324/158.1
[58] Field of Search .............................. 324/158.1, 537, 324/763, 73.1; 341/120; 371/22.1, 22.6

[56] References Cited

U.S. PATENT DOCUMENTS

| | | | |
|---|---|---|---|
| 4,922,492 | 5/1990 | Fasang et al. | 371/22.1 |
| 5,210,486 | 5/1993 | Wilson et al. | 324/158 R |
| 5,225,834 | 7/1993 | Imai et al. | 341/120 |

OTHER PUBLICATIONS

IC Master 1980, United Technical Publications, Inc., 645 Stewart Ave., Garden City, NY 11530; Intersil Integrated. Circuit (ICL 8052/ICL 7104), manufactured by Intersil, Inc., 10710 N. Tanau Ave, Cupertino, CA 95014, ref. pp. 786–800.

*Primary Examiner*—Ernest F. Karlsen
*Assistant Examiner*—Russell M. Kobert
*Attorney, Agent, or Firm*—Kevin G. Mierzwa; Roger L. May

[57] ABSTRACT

A structure for measuring and testing discrete components interconnected with one or more integrated circuits on a mixed-signal circuit board. Each integrated circuit includes a test cell comprising a plurality of switches connected with a single on-chip bus which is in turn connected with a single circuit board bus. The structure permits a constant current to be supplied to the components over the single bus and voltage measurements to be made to determine the component values with a lower overhead in pins and board area.

14 Claims, 6 Drawing Sheets

Fig. 1
(PRIOR ART)
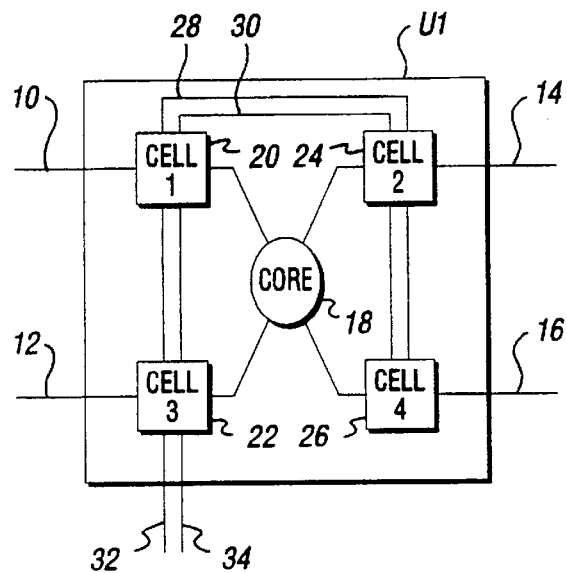
Fig. 2
(PRIOR ART)
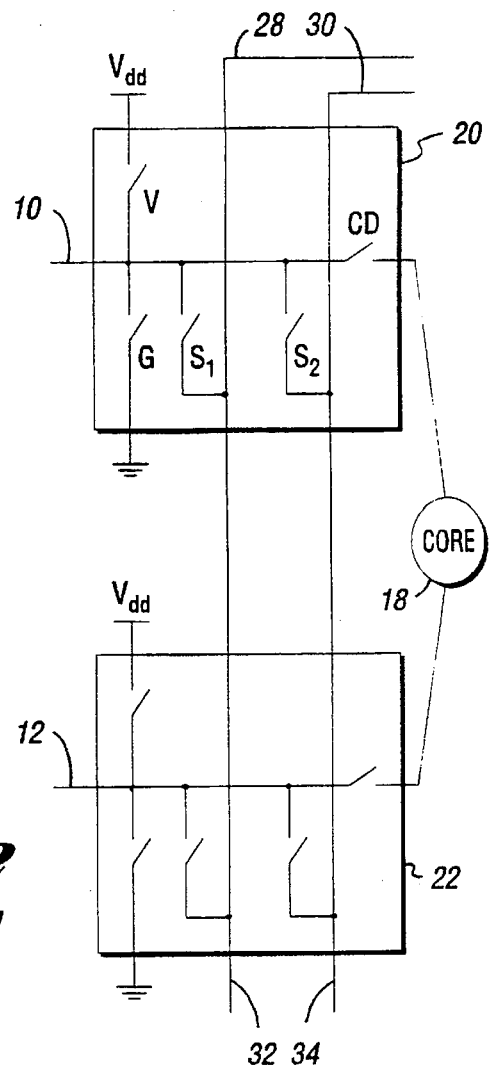
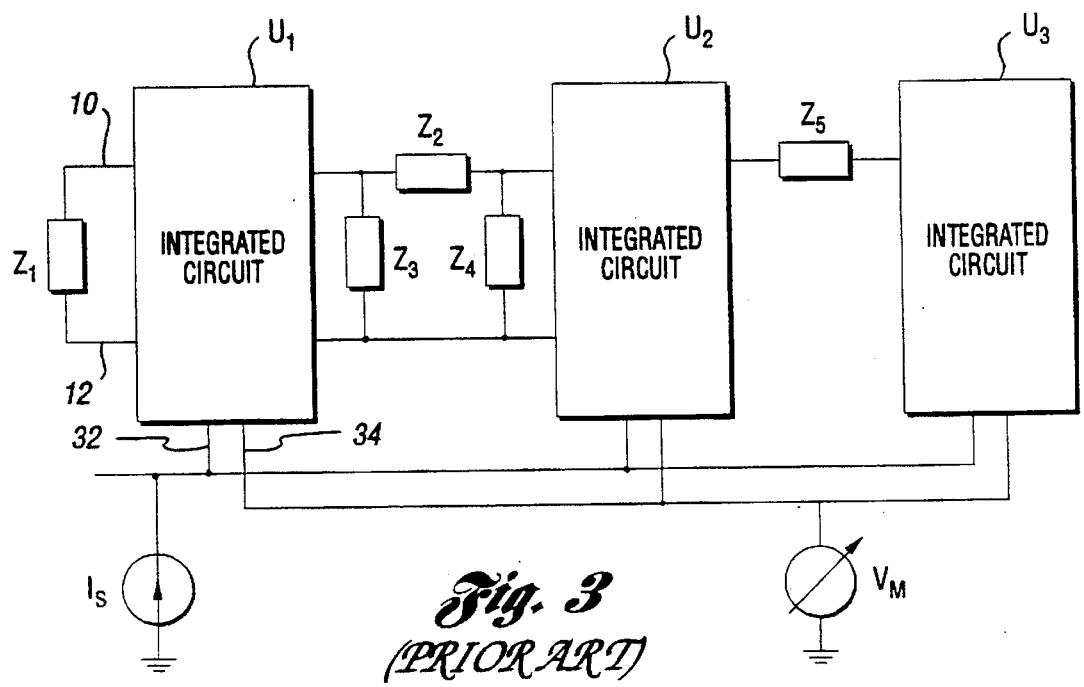
Fig. 3
(PRIOR ART)

METHOD AND CIRCUIT STRUCTURE FOR MEASURING AND TESTING DISCRETE COMPONENTS ON MIXED-SIGNAL CIRCUIT BOARDS

TECHNICAL FIELD

This invention relates to methods and circuits for measuring and testing mixed-signal circuit boards and more particularly to determining the values of discrete component interconnecting integrated circuits on the board and for detecting interconnect failures.

BACKGROUND ART

A method and circuit structure for determining the value of discrete components on mixed-signal boards was proposed in pending application U.S. patent application Ser. No. 08/071,461 filed Jun. 2, 1993, now abandoned and assigned to the assignee of the present invention. The structure defines cells to be placed at analog pins of an integrated circuit (IC), with each cell made up of five switches. Two analog buses are used to interconnect voltage supply, ground, analog core circuit in the IC, and the discrete components on board, in different configurations by controlling the switches in the cells. A current source is used as stimulus through one analog bus and a voltmeter measures voltage using another analog bus. The given metrology provides for measurement of voltages at the pins of an IC connected to a discrete component network (DCN), by passing a fixed current through the pins. The DCN can then be verified using the measured voltages. The switches in the cells are controlled by instructions using the JTAG/IEEE 1149.1 TAP controller, see "IEEE Standard Test Access Port and Boundary-Scan Architecture," IEEE Standard 1149.1–1990. A minimum of six extra pins (four for JTAG and two for the analog buses) are required on each mixed-signal IC in this approach.

The circuit structure described in the aforementioned patent application is shown schematically in FIGS. 1–3. In FIG. 1 an integrated circuit U1, contains four analog test pins 10–16 connected with an analog core circuit 18 through respective test cells 20–26. Analog buses 28 and 30 are connected with each test cell and to bus pins 32 and 34 of the circuit U1. As shown in greater detail in FIG. 2, each test cell includes five switches labeled V, G, $S_1$, $S_2$ and CD. These switches control the connection of the test pin to power rail ($V_{dd}$), ground, analog buses 28 and 30, and the analog core circuit 18, respectively. The core disconnect switch (CD) is conceptual and can be designed as part of the core circuit to minimize adverse effects on performance. FIG. 3 shows three mixed-signal ICs, generally designated U1, U2, and U3, interconnected with three different DCNs. The ICs and DCNs are all mounted on a circuit board. One of the DCNs comprises an impedance $Z_1$ connected across pins 10 and 12 of U1. A second DCN comprises a delta network made up of impedances $Z_2$, $Z_3$ and $Z_4$ connected between U1 and U2 and uses two pins of each IC. The third DCN comprises an impedance $Z_5$ connected between one pin on U2 and one pin of U3. Analog bus 28 in each IC is connected to a current source $I_s$, and analog bus 30 in each IC is connected to a voltmeter $V_m$ through the bus pins of each IC.

The metrology of the aforementioned patent application can be used to measure the values of $Z_1$, $Z_2$, $Z_3$, $Z_4$, and $Z_5$, and can be explained by considering an impedance Z connected between any two test cell as shown in FIG. 4(a). The metrology comprises the following steps.

Step 1: Configure the test cells as shown in FIG. 4(b) by closing $S_1$ and $S_2$ in Cell 1, G in Cell 2 and opening all other switches. $V_m$ will show voltage $V_1$ at Pin 1.
Step 2: Configure the cells as shown in FIG. 4(c) by closing $S_1$ in Cell 1, $S_2$ and G in Cell 2 and opening all other switches. $V_m$ will show voltage $V_2$ at pin 2.
Step 3: Compute Z as $$\frac{V_1 - V_2}{I_S}$$

The testing approach used in the above procedure is to pass a fixed current through Z and measure voltages at the Pins 1 and 2 between which the impedance is connected. The value of Z can then be computed using Ohm's law. The voltmeter $V_m$ has very high impedance compared to the ON-resistance $R_{s2}$ of switch $S_2$ in Cell 1. Therefore, in Step 1, $R_{s2}$ can be ignored in the computations to obtain a voltage at Pin 1 of $V_1 = (Z + R_G)I_S$, where $R_G$ is the ON-resistance of switch G in Cell 2. In Step 2, the ON-resistance of switch $S_2$ in Cell 2 is ignored in the computations to obtain a voltage at Pin 2 of $V_2 = R_G I_S$. The effect of $R_G$ is canceled when Z is computed in Step 3. This procedure requires two configurations of the cells, controlled by a JTAG/IEEE 1149.1 TAP controller.

The above testing procedure can be used to verify either $Z_1$ or $Z_5$ of FIG. 3. The testing of the delta network of FIG. 3 can be similarly accomplished. A total of six configurations of the four cells at the four pins are needed to test the delta network. In the method just described, the ON-resistance $R_{S1}$ of switch $S_1$ in Cell 1 does not affect the computations as the switch is not in the path of the voltmeter. This is generally true for the metrology of the aforementioned patent application, where a separate bus is used for connecting the voltmeter to the pin under consideration.

It would be advantageous if a single bus could be used to connect both the current source and the voltmeter to the DCN. Such a structure would result in lower overhead in pins and board area. One possible single bus approach is shown in FIG. 5. In order to pass a constant current from the source $I_s$ through DCN 50 over bus 52, it is necessary to close switch S. However, the voltmeter then measures the voltage at the bus pin 54 and not at analog test pin 56 as desired. Thus, the ON-resistance of Switch S represented at 58 would affect the voltage measured by the voltmeter $V_m$.

SUMMARY OF THE INVENTION

In view of the above, it is an object of the present invention to provide a method and circuit structure for measurement of discrete components on mixed-signal circuit boards using a single bus structure.

In accordance with the present invention a single bus structure is provided along with a cell structure which eliminates the effect of switch resistance during computations. The cell structure includes a pair of parallel switches connected between the single bus pin and the analog pin of the integrated circuit. The metrology used with this cell structure eliminates the effects of the ON-resistance of the switches.

BRIEF DESCRIPTION OF THE DRAWINGS

A more complete understanding of the present invention may be had from the following detailed description which should be read in conjunction with the drawings in which, FIGS. 1, 2, 3 and 4 are circuit diagrams showing a multiple-bus approach to measuring discrete components on a mixed-signal circuit board;

DETAILED DESCRIPTION OF PREFERRED EMBODIMENT

Figure 4A:
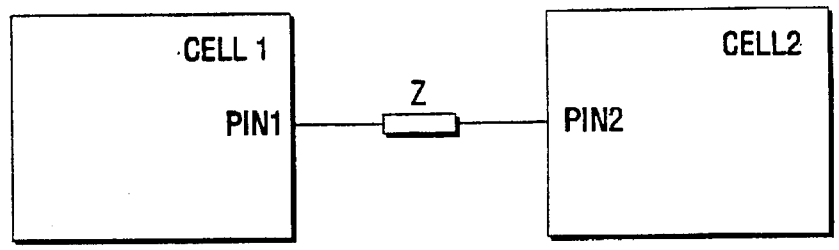
Figure 4B:
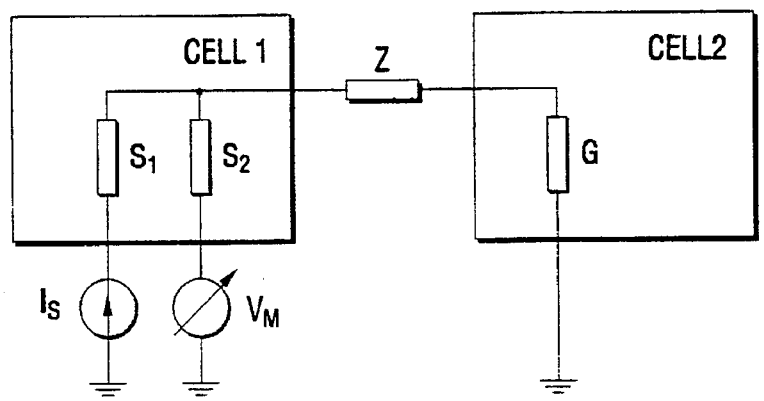
Figure 4C:
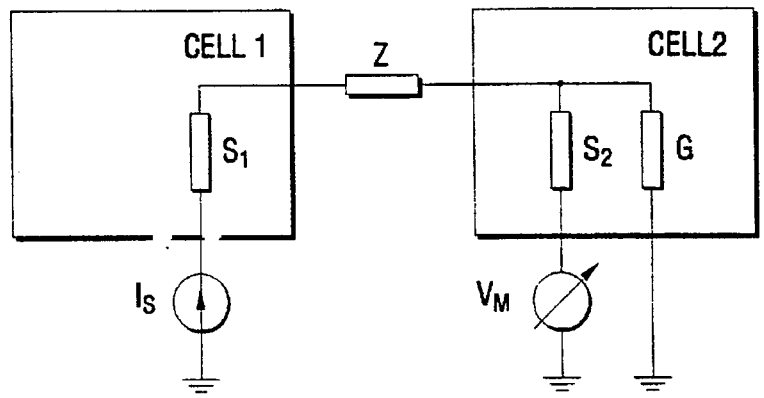
Figure 5:
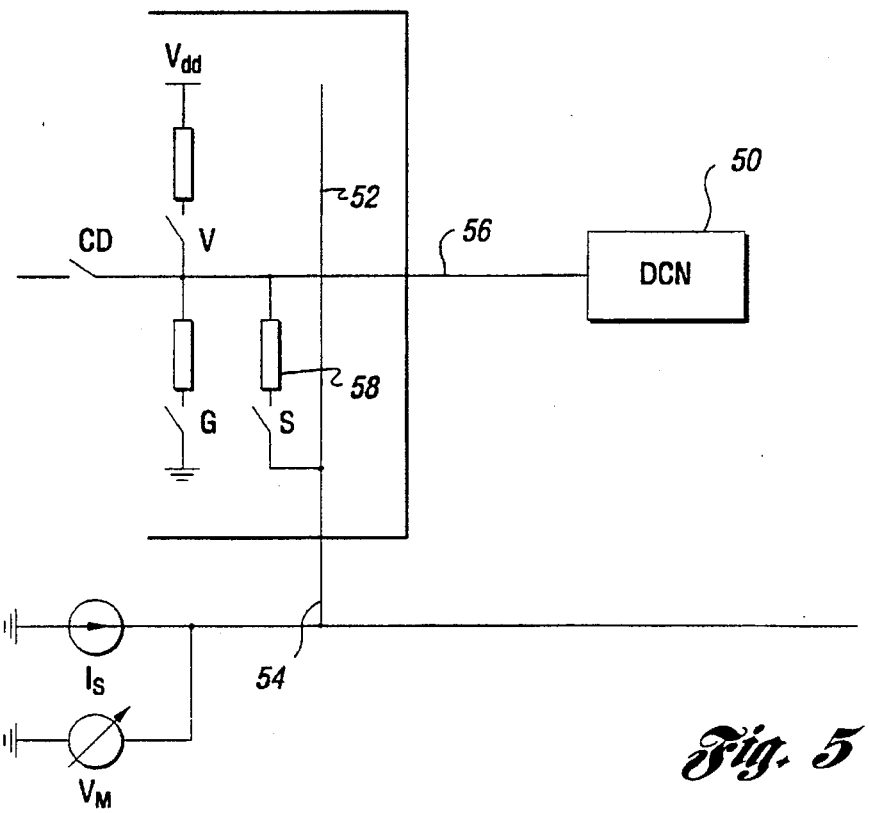
FIG. 5 is a circuit diagram showing a first single-bus approach to measuring discrete components on a mixed-signal circuit board.
Figure 6:
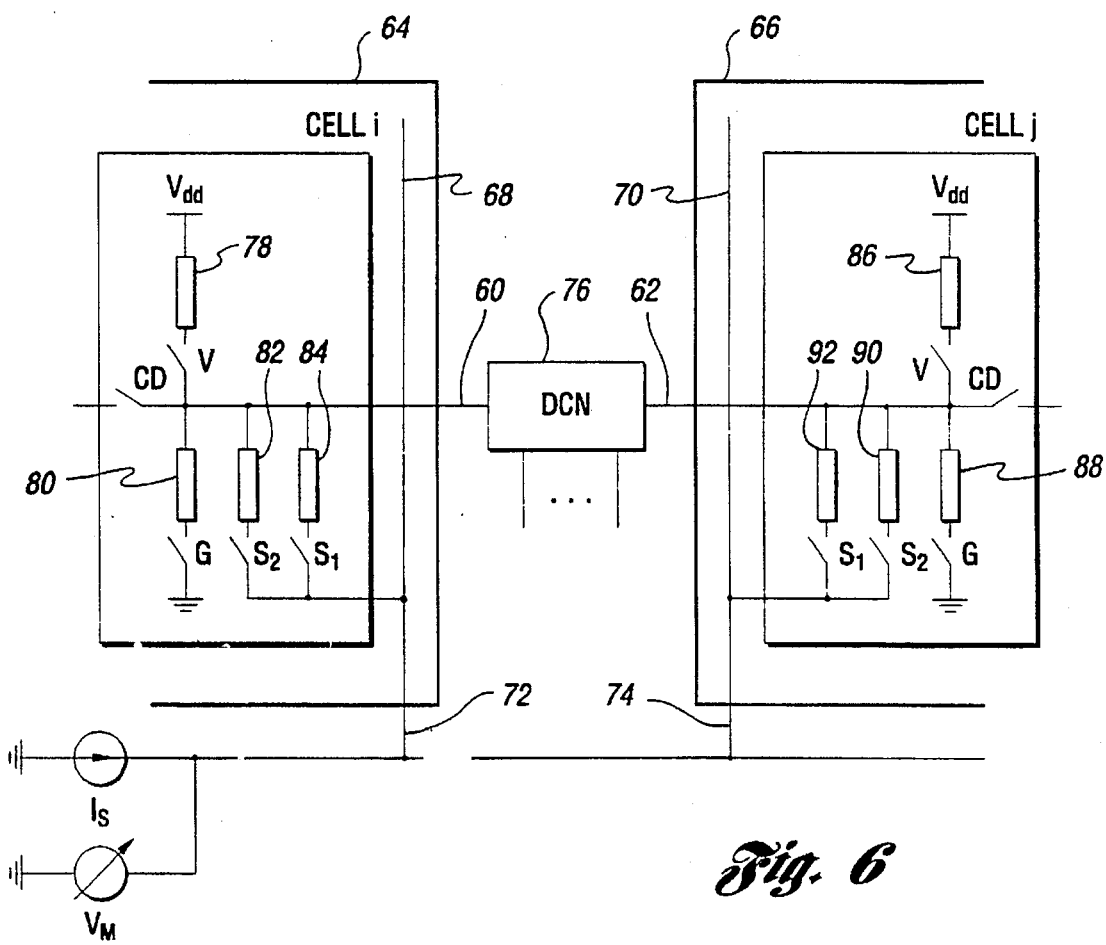
FIG. 6 is circuit diagram of a preferred embodiment of the present invention.

Referring now to FIG. 6 a preferred embodiment of the single-bus structure of the present invention is shown. Cells i and j are added at analog pins 60 and 62 of the IC's 64 and 66 respectively. Cells i and j are connected to a single analog bus 68 and 70 respectively included on each IC. The buses 68 and 70 are connected to respective bus pins 72 and 74 on ICs 64 and 66. The cells are made up of switches V, G, CD, $S_1$ and $S_2$. Switches V, G, and CD are similar to those of FIGS. 1–4. Switches $S_1$ and $S_2$ are connected in parallel and are used differently than in FIGS. 1–4. Closure of either $S_1$ or $S_2$, or both $S_1$ and $S_2$, will connect the current source $I_s$ and the voltmeter $V_m$ to the DCN 76 on board. The reasons for such a parallel connection will be explained in the metrology discussion below. The series ON-resistance of the switches in the Cells i and j are indicated at 78–84, and 86–92. Switches $S_1$ and $S_2$ should be implemented so that their ON-resistances are substantially identical. The switches in the cells are controlled by instructions using the JTAG/IEEE 1149.1 TAP controller.

The DCN 76 in FIG. 6 is connected between analog pins 60 and 62 of ICs 64 and 66. The DCN 76 may be a single resistor, in which case there will be no other connections. The DCN 76 may instead be a delta network, in which case there will be one other connection. This connection may be grounded or connected to other analog pins of ICs 64 and 66. The DCN 76 may also be a more complex network involving connections to ground, power supply, and other analog pins of ICs 64, 66, or other ICs.

The following steps describe the metrology to measure the component values in the DCN 76 of FIG. 6. It is assumed that none of the other connections to the DCN 76 are connected to ground. The metrology can be easily adapted to the case where the other connections to the DCN 76 may be grounded. Let $R_G^i$ represent the ON-resistance of switch G, and $R_s^i$ represent the ON-resistance of switch $S_1$ or $S_2$, in Cell i.

Step 1: Close $S_1$ and open all other switches in Cell i of IC 64. Close G and open all other switches in Cell j of IC 66. A constant current path is created through the DCN 76.

The voltmeter $V_m$ will measure a voltage $V_1$ at the bus pin 72 of IC 64 according to the equation $V_1=(R_s^i+R_G^j+Z_N)I_s$, where $Z_N$ represents the impedance of DCN 76 in the configuration set up by the switches.

Step 2: Close $S_1$ and $S_2$, and open all other switches in Cell i of IC 64; close G and open all other switches in Cell j of IC 66. The voltmeter $V_m$ will measure the voltage $V_2$ at the bus pin 72 of IC 64 according to the equation $$V_2 = \left( \frac{R_s^i}{2} + R_G^j + Z_N \right) I_s$$

The equations obtained above are linearly independent in $R_s^i$. Solving these equations produces $(R_G^j+Z_N)I_s=2V_2-V_1$. The effect of $R_s^i$ is thus eliminated. This is the reason for the parallel connection of switches $S_1$ and $S_2$.

Step 3: Configure the switches and make enough voltage measurements at the Bus pins so that independent equations can be used for eliminating $R_G^j$ and solving for the component variables in $Z_N$. The number of configurations needed will depend on the structure of DCN.

As an example, if the DCN is a resistor, then two more voltage measurements are needed. One measurement, represented by the equation $V_3=(R_s^j+R_G^j)I_s$ is made by closing $S_1$ and G in Cell j of IC 66, and opening all other switches in both IC 64 and IC 66. The second measurement, represented by the equation $$V_4 = \left( \frac{R_s^j}{2} + R_G^j \right) I_s$$

is made by closing $S_1$, $S_2$, and G in Cell j of IC 66, and opening all other switches in both IC 64 and IC 66. These two measurements will permit determination of $R_G^j$, which can be used to obtain the DCN resistor value from the equation obtained from Steps 1 and 2. It will be understood that the above metrology can be adapted to DCNs that are connected to only one IC.

Circuit simulations have been performed on four different DCNs. The four DCNs investigated are: (i) A resistor between two ICs, (ii) A resistor with one terminal connected to ground, (iii) A delta network with one node connected to ground, and (iv) A delta network with no node connected to ground. The circuit simulation was performed on these networks using SPICE for a 2 μm technology robust industrial process. Each switch was implemented as a MOSFET with W of 20 μm and L of 2 μm. These values are based upon the commonly used data in 2 μm technology MOS ICs. Furthermore, the design parameters (W/L ratio, bulk threshold parameter Y, zero-bias threshold voltage $V_{to}$, transconductance coefficient K') of switches $S_1$ and $S_2$ in each cell were set to the same value, so that they will have almost identical ON-resistance. The $V_{dd}$ was set to 5 V and current $I_s$ was generated using a 1 KHz sinusoidal source. The strength of $I_s$ is always chosen so that the switches operate in the linear region. For DCNs with impedances of 30Ω or less, an $I_s$ was chosen to yield minimum error.

Figure 7:
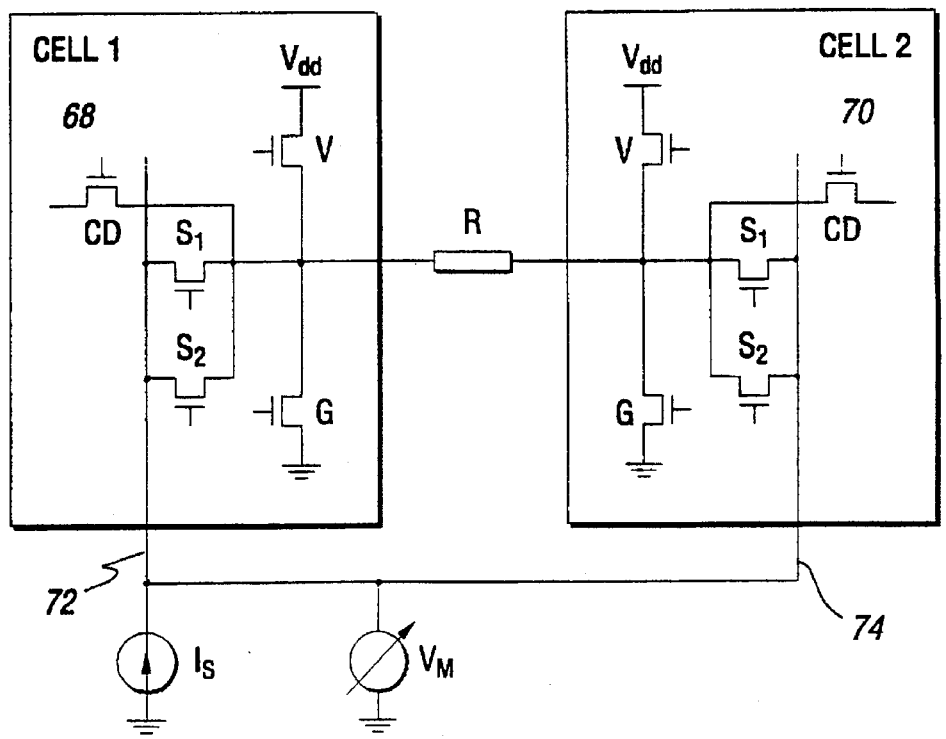
FIG. 7 shows a test circuit structure in accordance with the present invention, where the discrete component network comprises a single resistor with no terminal connected to ground.

Case 1: Single resistor between two ICs with no terminal connected to ground. The test structure for this case is shown in FIG. 7. Simulations were performed for the value of R ranging from 500 kΩ to 1Ω. Voltages $V_1$, $V_2$, $V_3$, and $V_4$ were obtained using the following four configurations.

Configuration 1:

Close $S_1$ in Cell 1 and G in Cell 2, open all other switches. If simulated voltage at Bus pin 72 of Cell 1 is represented as $V_1$, then $$R_S^1 + R + R_G^2 = \frac{V_1}{I_S} \quad \text{(EQ 1)}$$

Configuration 2:
Close $S_1$, $S_2$ in Cell 1 and G in Cell 2, open all other switches. If simulated voltage at Bus pin 72 of Cell 1 is represented as $V_2$, then $$\frac{R_S^1}{2} + R + R_G^2 = \frac{V_2}{I_S} \quad \text{(EQ 2)}$$

Configuration 3:
Close $S_1$ and G in Cell 2, open all other switches. If simulated voltage at the Bus pin 74 of Cell 2 is represented as $V_3$, then $$R_S^2 + R_G^2 = \frac{V_3}{I_S} \quad \text{(EQ 3)}$$

Configuration 4:
Close $S_1$, $S_2$ and G in Cell 2, open all others. If simulated voltage at Bus pin 74 of Cell 2 is represented as $V_4$, then $$\frac{R_S^2}{2} + R_G^2 = \frac{V_4}{I_S} \quad \text{(EQ 4)}$$

Equations 1 and 2 can be used to compute $R+R_G^2$ and equations (3) and (4) yield the value of $R_G^2$. Thus R can be computed.

Let $R_c$ denote the computed values and use $$\frac{|R - R_c|}{R}$$

to obtain the error. Table 1 contains the results of simulation. The row for R=10000Ω indicates $I_S$=50 μA. The combination of R=10000Ω and $I_S$=50 μA ensures that the switches operate in their linear regions. The row for R=10Ω indicates $I_S$=100 μA is the best input for testing with $R_c$=10.1Ω and the resulting error is 1%; the combination of R=10Ω and $I_S$=100 μA also ensures that the switches operate in their linear ranges.

TABLE 1

| R (Ω) | $I_s$ (μA) | $V_1$ (mV) | $V_2$ (mV) | $V_3$ (mV) | $V_4$ (mV) | $R_c$ (Ω) | Error (%) |
|---|---|---|---|---|---|---|---|
| 500000 | 5 | 2508.05 | 2505.08 | 4.27 | 3.20 | 49996.00 | 0.001 |
| 100000 | 20 | 2025.71 | 2017.11 | 17.10 | 12.82 | 99998.50 | 0.002 |
| 10000 | 50 | 545.93 | 533.63 | 42.86 | 32.12 | 9999.00 | 0.010 |
| 1000 | 100 | 187.47 | 165.12 | 86.35 | 64.56 | 1000.00 | 0.000 |
| 100 | 100 | 96.46 | 74.62 | 86.35 | 64.56 | 100.10 | 0.100 |
| 10 | 100 | 87.36 | 65.57 | 86.35 | 64.56 | 10.10 | 1.000 |
| 1 | 100 | 86.45 | 64.66 | 86.35 | 64.56 | 1.00 | 0.000 |

From Table 1 it is seen that the proposed single-bus structure and metrology can measure resistances connected as shown in FIG. 7 with 99% accuracy.

Figure 8:
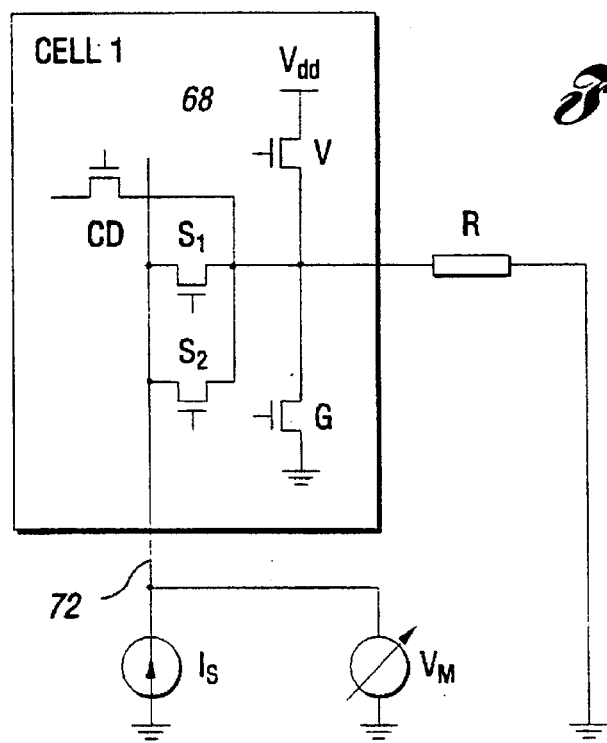
FIG. 8 shows a test circuit structure in accordance with the present invention, where the discrete component network comprises a single resistor with one terminal connected to ground.

Case 2: Single resistor with one terminal connected to ground. The test structure is shown in FIG. 8. Simulations were performed similar to those with respect to FIG. 7, using the following two configurations.

Configuration 1:
Close $S_1$ and open other switches. If simulated voltage at Bus pin 72 is represented as $V_1$, then $$R_S^1 + R = \frac{V_1}{I_S} \quad \text{(EQ 5)}$$

Configuration 2:
Close $S_1$, $S_2$ and open other switches. If simulated voltage at Bus pin 72 is represented as $V_2$, then $$\frac{R_S^1}{2} + R = \frac{V_S}{I_2} \quad \text{(EQ 6)}$$

TABLE 2

| R (Ω) | $I_s$ (μA) | $V_1$ (mV) | $V_2$ (mV) | $R_c$ (Ω) | Error (%) |
|---|---|---|---|---|---|
| 500000 | 5 | 2505.90 | 2502.95 | 500000.00 | 0.000 |
| 100000 | 20 | 2017.09 | 2008.53 | 9998.50 | 0.002 |
| 10000 | 50 | 524.39 | 512.17 | 9999.00 | 0.010 |
| 1000 | 50 | 71.61 | 60.76 | 998.20 | 0.180 |
| 100 | 50 | 26.42 | 15.69 | 99.20 | 0.800 |
| 30 | 40 | 18.30 | 9.74 | 29.50 | 1.667 |
| 20 | 40 | 17.90 | 9.34 | 19.50 | 2.500 |
| 10 | 40 | 17.50 | 8.94 | 9.50 | 5.000 |
| 1 | 50 | 21.44 | 10.73 | 0.40 | 60.000 |

These two equations can be used to calculate the value of R. Table 2 contains a row for each R with the chosen $I_S$ values where the error was minimum.

From Table 2 it is seen that the proposed single-bus structure and metrology can measure resistances connected as shown in FIG. 8 with accuracy of over 99% for R>30Ω. This indicates that the proposed method can be used for all practical cases, as smaller resistances will generally be integrated into the IC.

Figure 9A:
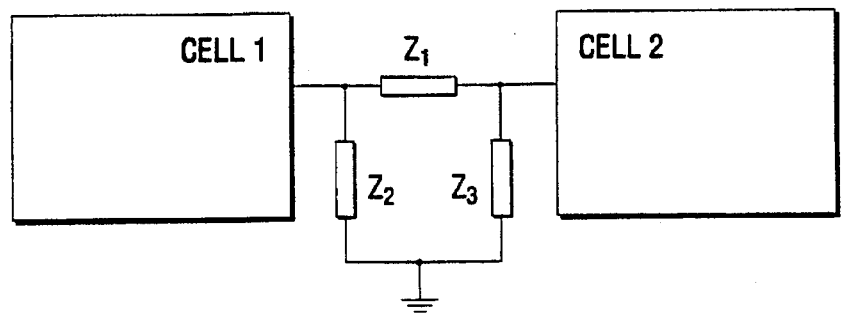
FIGS. 9a and 9b show a test circuit structure in accordance with the present invention, where the discrete component network comprises a delta network with one node connected to ground.
Figure 9B:
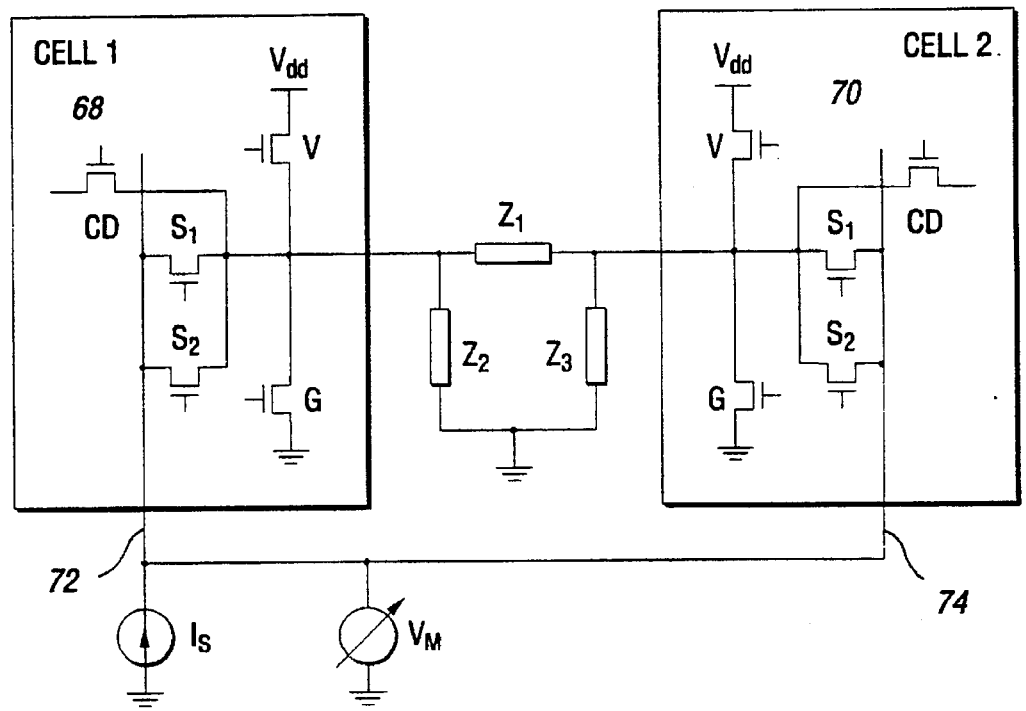

Case 3: Delta network with one node connected to ground. The delta network is shown in FIGS. 9a and 9b. It is composed of impedances $Z_1$, $Z_2$, and $Z_3$. Consider a specific delta network having $Z_1=R_1=2$ KΩ;

$$Z_2 = \frac{1}{j2\pi f c}$$

with C=0.1 μF and $Z_3=R_2=4$ KΩ

Figure 10:
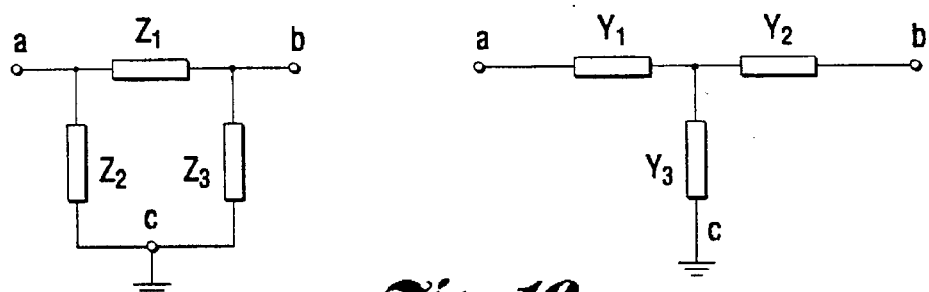
FIG. 10 shows the equivalent Y network for the delta network of FIGS. 9a and 9b.

The structure was simulated with $I_S$ of 50 μA at 1 KHz. Eight configurations were used to measure voltages $V_1$ through $V_8$, as shown below. The computed values $Z_{1c}$, $Z_{2c}$ and $Z_{3c}$ can be calculated from the equations obtained from these configurations. The delta network was modeled as a Y network as shown in FIG. 10, with impedances $Y_1$, $Y_2$ and $Y_3$, to simplify the computations.

Configuration 1:
Close $S_1$ in Cell 1 and open other switches. If simulated voltage at Bus pin 72 is represented as $V_1$, then $$R_S^1 + Y_1 + Y_3 = \frac{V_1}{I_S} \quad \text{(EQ 7)}$$

Configuration 2:
Close $S_1$ and $S_2$ in Cell 1 and open other switches. If simulated voltage at Bus pin 72 is represented as $V_2$, then $$\frac{R_S^1}{2} + Y_1 + Y_3 = \frac{V_2}{I_S} \quad \text{(EQ 8)}$$

Configuration 3:
Close $S_1$ in Cell 2 and open other switches. If simulated voltage at Bus pin 74 is represented as $V_3$, then $$R_s^2 + Y_2 + Y_3 = \frac{V_3}{I_S} \quad \text{(EQ 9)}$$

Configuration 4:
Close $S_1$, $S_2$ in Cell 2 and open other switches. If simulated voltage at Bus pin 74 is represented as $V_4$, then $$\frac{R_S^2}{2} + Y_2 + Y_3 = \frac{V_4}{I_S} \quad \text{(EQ 10)}$$

Configuration 5:

Close $S_1$ in Cell 1 and G in Cell 2 and open other switches. If simulated voltage at Bus pin 72 is represented as $V_5$, then $$R_S^1 + Y_1 + \frac{(Y_2 + R_G^2)Y_3}{Y_2 + Y_3 + R_G^2} = \frac{V_5}{I_S} \quad \text{(EQ 11)}$$

Configuration 6:

Close $S_1$, $S_2$ in Cell 1 and G in Cell 2 and open other switches. If simulated voltage at Bus pin 72 is represented as $V_6$, then $$\frac{R_S^1}{2} + Y_1 + \frac{(Y_2 + R_G^2)Y_3}{Y_2 + Y_3 + R_G^2} = \frac{V_6}{I_S} \quad \text{(EQ 12)}$$

Configuration 7:

Close $S_1$ and G in Cell 2 open other switches. If simulated voltage at Bus pin 74 is represented as $V_7$, then $$R_S^2 + \frac{(Y_2 + Y_3)R_G^2}{Y_2 + Y_3 + R_G^2} = \frac{V_7}{I_S} \quad \text{(EQ 13)}$$

Configuration 8:

Close $S_1$, $S_2$ and G in Cell 2 and open other switches. If simulated voltage at Bus pin 74 is represented as $V_8$, then $$\frac{R_S^2}{2} + \frac{(Y_2 + Y_3)R_G^2}{Y_2 + Y_3 + R_G^2} = \frac{V_8}{I_S} \quad \text{(EQ 14)}$$

The measured values of $V_1$ through $V_8$ are given in Table 3. The values for $Y_1$, $Y_2$ and $Y_3$ can be calculated using Equations (7) to (14). These values are given in Table 4. The standard Y-to-delta conversion method is then used to calculate $Z_{1c}$, $Z_{2c}$ and $Z_{3c}$, the computed values of the components of the delta network. These values are given in Table 5. In Table 5, the values for $Z_{1c}$ and $Z_{3c}$ contain small imaginary parts, and the value for $Z_{2c}$ contains a small real part. These small values should not be present if the switches are ideal. These small errors are therefore discarded to obtain the component values. The values for $R_1$ and $R_2$ of the delta network are calculated by taking the real parts of $Z_{1c}$ and $Z_{3c}$, respectively. The value for C is computed using the imaginary part of $Z_{2c}$ as $$\frac{1}{2\pi f Im(Z_{2c})}.$$

Note that the sign of the imaginary part for $Z_{2c}$ in Table 5 is negative because $Z_2$ is a capacitor. If $Z_2$ had been inductor, then the sign of the imaginary part in $Z_{2c}$ would be positive with value $$\frac{Im(Z_{2c})}{2\pi f}.$$

This yields $Z_1 = R_1 = 1998\Omega$, $Z_3 = R_2 = 3997\Omega$ and $C = 0.1$ μF.

TABLE 3

| | |
|---|---|
| $V_1$ (mV) | 41.217 − j74.346 |
| $V_2$ (mV) | 30.451 − j74.346 |
| $V_3$ (mV) | 97.231 − j33.043 |
| $V_4$ (mV) | 86.312 − j33.043 |
| $V_5$ (mV) | 58.326 − j55.068 |

TABLE 3-continued

| | |
|---|---|
| $V_6$ (mV) | 47.513 − j55.068 |
| $V_7$ (mV) | 38.631 − j1.443 |
| $V_8$ (mV) | 27.871 − j1.443 |

TABLE 4

| $Y_1$ (Ω) | $Y_2$ (Ω) | $Y_3$ (Ω) |
|---|---|---|
| 130.544 − j495.697 | 1244.845 + j330.447 | 263.155 − j991.303 |

TABLE 5

| $Z_{1C}$ (Ω) | $Z_{2C}$ (Ω) | $Z_{3C}$ (Ω) |
|---|---|---|
| 1998.000 − j1.324 | −1.038 − j1591.000 | 3997.000 + j5.235 |

Thus the proposed structure and metrology can be effective to test DCNs of the kind shown in FIG. 9(a).

Figure 11A:
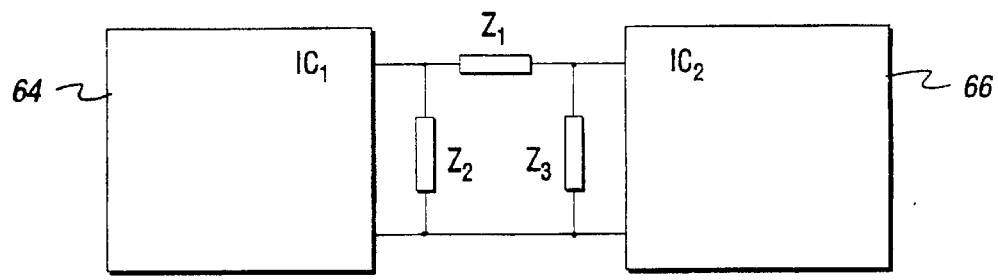
FIGS. 11a and 11b shows a test circuit structure in accordance with the present invention, where the discrete component network comprises a delta network with no node connected to ground.

Case 4: Delta network with no node connected to ground. The delta network is shown in FIG. 11(a). It is composed of impedances $Z_1$, $Z_2$, and $Z_3$. The specific delta network considered had the same values as in Case 3. Similar to Case 3, the structure given in FIG. 11(b) was simulated with $I_S = 50$ μA at 1 KHz. Ten configurations were used to measure voltages $V_1$ through $V_{10}$ as shown below. Similar to Case 3, these ten equations were obtained from the configurations by considering the equivalent Y network.

Configuration 1:

Close $S_1$ in Cell 1 and G in Cell 2 and open other switches. If simulated voltage at Bus pin is represented as $V_1$, then $$R_S^1 + Y_1 + Y_2 + R_G^2 = \frac{V_1}{I_S} \quad \text{(EQ 15)}$$

Configuration 2:

Close $S_1$ and $S_2$ in Cell 1 and G in Cell 2 and open other switches. If simulated voltage at Bus pin is represented as $V_2$, then $$\frac{R_S^1}{2} + Y_1 + Y_2 + R_G^2 = \frac{V_2}{I_S} \quad \text{(EQ 16)}$$

Configuration 3:

Close $S_1$ in Cell 1 and G in Cell 3 and open other switches. If simulated voltage at Bus pin is represented as $V_3$, then $$R_S^1 + Y_1 + Y_3 + R_G^3 = \frac{V_3}{I_S} \quad \text{(EQ 17)}$$

Configuration 4:

Close $S_1$, $S_2$ in Cell 1 and G in Cell 3 and open other switches. If simulated voltage at Bus pin is represented as $V_4$, then $$\frac{R_S^1}{2} + Y_1 + Y_3 + R_G^3 = \frac{V_4}{I_S} \quad \text{(EQ 18)}$$

Configuration 5:

Close $S_1$ in Cell 2 and G in Cell 3 and open other switches. If simulated voltage at Bus pin is represented as $V_5$, then $$R_S^2 + Y_2 + Y_3 + R_G^3 = \frac{V_5}{I_S} \quad \text{(EQ 19)}$$

Configuration 6:

Close $S_1$, $S_2$ in Cell 2 and G in Cell 3 and open other switches if simulated voltage at Bus pin is represented as $V_6$, then $$\frac{R_S^2}{2} + Y_2 + Y_3 + R_G^3 = \frac{V_6}{I_S} \quad \text{(EQ 20)}$$

Configuration 7:

Close $S_1$ and G in Cell 2 and open other switches. If simulated voltage at Bus pin is represented as $V_7$, then $$R_S^2 + R_G^2 = \frac{V_7}{I_S} \quad \text{(EQ 21)}$$

Configuration 8:

Close $S_1$, $S_2$ and G in Cell 2 and open other switches. If simulated voltage at Bus pin is represented as $V_8$, then $$\frac{R_S^2}{2} + R_G^2 = \frac{V_8}{I_S} \quad \text{(EQ 22)}$$

Configuration 9:

Close $S_1$ and G in Cell 3 and open other switches. If simulated voltage at Bus pin is represented as $V_9$, then $$R_S^3 + R_G^3 = \frac{V_9}{I_S} \quad \text{(EQ 23)}$$

Configuration 10:

Close $S_1$, $S_2$ and G in Cell 3 and open other switches. If simulated voltage at Bus pin is represented as $V_{10}$, then $$\frac{R_S^3}{2} + R_G^3 = \frac{V_{10}}{I_S} \quad \text{(EQ 24)}$$

Figure 11B:
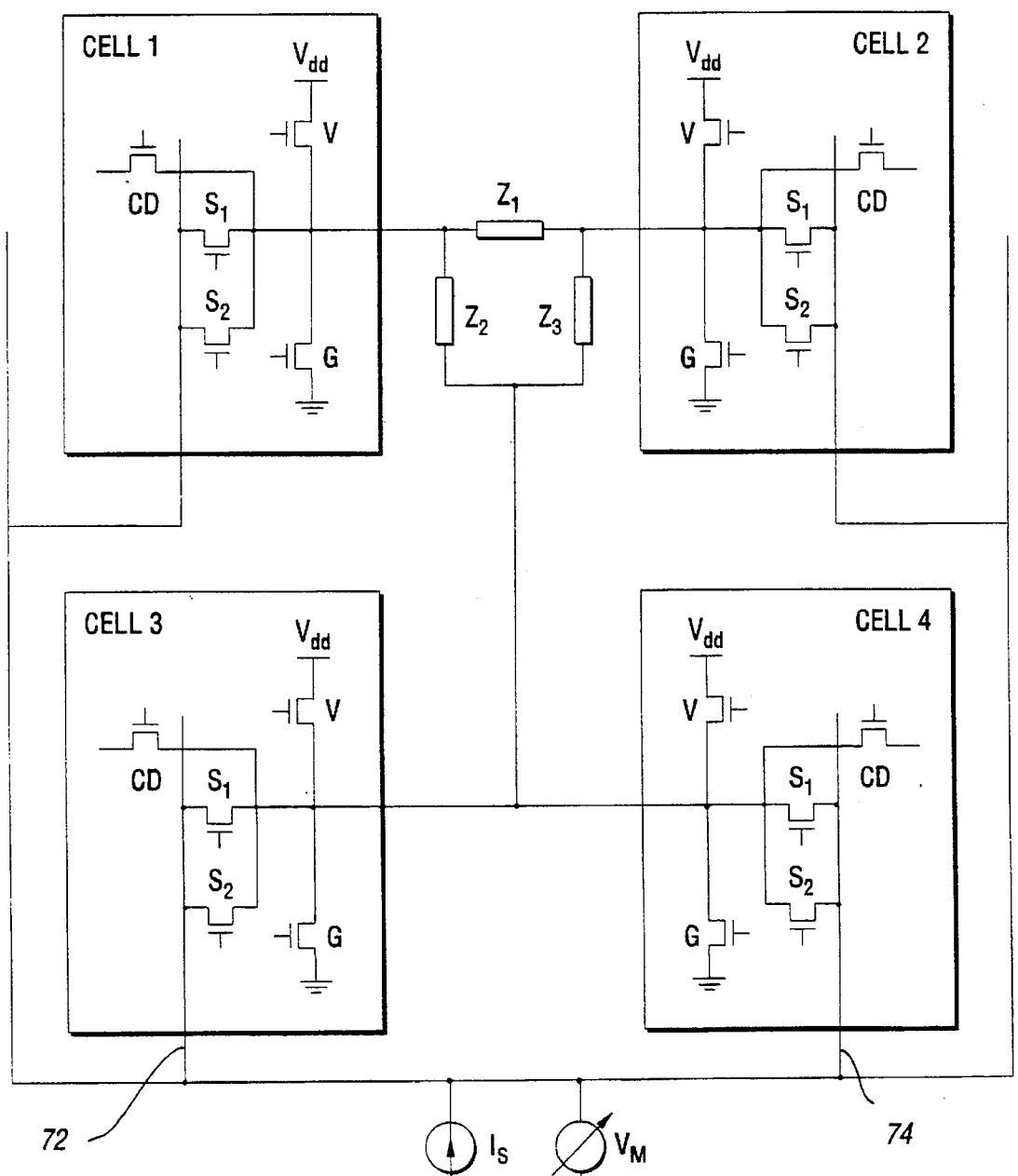

These equations were used to get the computed component values as $R_1=2000\Omega$, $R_2=4001\Omega$ and $C=0.1$ μF. Thus, the proposed structure and metrology can be effectively used to test DCNs of the kind shown in FIG. 11(a). It should be understood that while the Cells 1–4 of FIG. 11b are shown as formed on two integrated circuits the four cells could be formed on a single integrated circuit or on three or four separate integrated circuits.

The structure proposed by the present invention and that of the aforementioned patent application can be compared as follows:

(i) The present structure requires one pin in addition to the JTAG pins (4 or 5) per mixed-signal IC. The structure of the aforementioned patent application requires two pins in addition to the JTAG pins.

(ii) Both structures require cells with five switches at each analog pin of a mixed-signal IC, as shown in FIGS. 2 and 6. The five switches are V, G, $S_1$, $S_2$ and CD. Switches V, G, and CD have identical roles in the two structures. In the aforementioned patent application, $S_1$ is connected to one bus and $S_2$ is connected to the other bus. In the present structure, $S_1$ and $S_2$ are placed in parallel and connected to the single bus.

(iii) the voltmeter used in the aforementioned patent application is assumed to be ideal, therefore the impedance of $V_m$ is ignored in the calculations. This introduces errors in the computed values of components in the DCN, since less than the total current $I_s$ flows through it in real situations. The present invention does not have this restriction as it is possible to know the exact current value that flows through the DCN in all configurations.

(iv) In general, the number of measurements needed for the approach of the present invention is more than the number needed for the aforementioned patent application. The following table gives the measurements needed for the two methods.

TABLE 6

| Network | The number of measurements in old method | The number of measurements in new method |
|---|---|---|
| Single resistor with no terminal connected to ground | 2 | 4 |
| Single resistor with one terminal connected to ground. | 1 | 2 |
| The delta network has one node connected to ground. | 4 | 8 |
| The delta network with no node connected to ground. | 6 | 10 |

(v) The computations needed for the two structures to obtain the discrete component values are different, but comparable for practical circuits. This was demonstrated by considering the delta network, which can be used to represent typical interconnect networks on boards.

While the best mode for carrying out the invention has been described in detail, those familiar with the art to which this inventions relates will recognize alternative designs and embodiments for practicing the invention as defined by the following claims:

We claim:

1. A mixed-signal integrated circuit comprising a single test bus connected with a single test bus pin, at least one analog pin for connecting an external electrical component with said integrated circuit, at least a first test cell forming a part of said integrated circuit, each test cell including first and second parallel connected electronic switches of substantially identical ON-resistance connected between an analog pin and said test bus, each test cell further including a third electronic switch connected between said analog pin and ground, said integrated circuit further including an analog core circuit and additional electronic switch means operable in one state to connect said analog core circuit to said analog pin and in the other state to disconnect said analog core circuit from said analog pin.

2. The integrated circuit of claim 1 including a plurality of analog pins connected with respective ones of a plurality of test cells, said test bus pin of each of said test cells interconnected by said single test bus.

3. A circuit board having at least a first integrated circuit, as defined in claim 2, mounted thereon, said board containing a single board test bus connected with the bus pin on said first integrated circuit, a discrete component network mounted on said board and having a first node connected with a first of said plurality of analog pins and a second node connected with a second of said plurality of analog pins.

4. A method of determining the value of components within the network mounted on the circuit board of claim 3, using a constant current source connected with said board test bus, and a voltage detector connected with said board test bus, comprising a sequence of steps including the steps of;

(a) closing only the first switch in a first of said plurality of test cell and only the third switch in a second of said plurality of test cell and measuring the voltage at the board test bus, (b) closing only the first and second switches in said first test cell and only the third switch in said second test cell and measuring the voltage at the board test bus, (c) closing the first and third switches in said second test cell and opening the remaining ones of said switches in said first and second test cells, and measuring the voltage at the board test bus, (d) closing the first, second and third switches in said second test cell and opening the remaining ones of said switches in said first and second test cell, and measuring the voltage at the board test bus (e) using the voltage measurements obtained in steps (a)–(d) to determine the value of said components.

5. A circuit board having at least a first integrated circuit, as defined in claim 2, mounted thereon, said board containing a single board test bus connected with the bus pin on said first integrated circuit, a discrete component network mounted on said board and having a first node connected with a first of said plurality of analog pins, a second node connected with a second of said plurality of analog pins and a third node connected with ground.

6. A circuit board having at least a first integrated circuit, as defined in claim 2, mounted thereon, said board containing a single board test bus connected with the bus pin on said first integrated circuit, a discrete component network mounted on said board and having a first node connected with a first of said plurality of analog pins, a second node connected with a second of said plurality of analog pins and a third node connected with a third and a fourth of said plurality of analog pins.

7. The integrated circuit of claim 1 wherein each test cell further comprising a fourth electronic switch connecting said analog pin to a source of voltage.

8. A circuit board having at least a first integrated circuit, as defined in claim 1, mounted thereon, said board containing a single board test bus connected with said test bus pin on each integrated circuit, a discrete component network mounted on said board and having at least a first node, means connecting said first node to the analog pin on said first integrated circuit, and component value measuring means connected with said board test bus for measuring the value of at least one component of said discrete component network.

9. The circuit board of claim 8, wherein said component value measuring means includes a constant current source connected with said board test bus for applying a current to said one component through at least one of said first and second electronic switches, and a voltage detector connected with said board test bus for measuring the voltage across said one component.

10. The invention defined in claim 9 wherein said discrete component network includes a second node connected to ground.

11. The invention defined in claim 10 wherein said network comprises a resistor.

12. A method of determining the value of the resistor of claim 11, using the current source and detector, comprising a sequence of steps including the steps of;

(a) supplying a current to said network from said source through said first switch in the test cell on the integrated circuit and measuring a first voltage at the board test bus, (b) supplying a current to said network from said source through said first and second switches in the test cell on the integrated circuit and measuring a second voltage at the bus pin of the integrated circuit, (c) using the first and second voltage measurements to determine the value of said resistor.

13. A circuit board having at least first and second integrated circuits, as defined in claim 1, mounted thereon, said board containing a single board test bus connected with the bus pin on each of said first and second integrated circuits, a discrete component network mounted on said board and having a first node connected to the analog pin on said first integrated circuit and a second node connected to the analog pin on said second integrated circuit.

14. A circuit board having at least first and second integrated circuits as defined in claim 1 mounted thereon, the first integrated circuit including first and third test cell, the second integrated circuit including second and fourth test cells, said board containing a single board test bus connected with the bus pin on each of said integrated circuits, a discrete component network mounted on said board and having first and second nodes connected through analog pins on said first and second integrated circuits to said first and second cells respectively and a third node connected through analog pins on said first and second integrated circuits to said third and fourth cells respectively, and a current source and detector connected with said board test bus.

* * * * *